United States Patent
Suzuki et al.

(10) Patent No.: US 8,337,622 B2
(45) Date of Patent: Dec. 25, 2012

(54) MANUFACTURING APPARATUS AND METHOD FOR SEMICONDUCTOR DEVICE

(75) Inventors: Kunihiko Suzuki, Shizuoka-ken (JP); Shinichi Mitani, Numazu (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 0 days.

(21) Appl. No.: 12/903,384

(22) Filed: Oct. 13, 2010

(65) Prior Publication Data
US 2011/0092075 A1   Apr. 21, 2011

(30) Foreign Application Priority Data
Oct. 16, 2009   (JP) .................................. 2009-238931

(51) Int. Cl.
C23C 16/50 (2006.01)
C23C 16/00 (2006.01)
C23F 1/00 (2006.01)
H01L 21/301 (2006.01)

(52) U.S. Cl. ........ 118/730; 118/715; 118/728; 118/729; 156/345.51; 156/345.54; 156/345.55

(58) Field of Classification Search .................. 118/715, 118/728–733; 156/345.51–345.55
See application file for complete search history.

(56) References Cited

U.S. PATENT DOCUMENTS

| | | | |
|---|---|---|---|
| 4,271,103 A * | 6/1981 | McAlister | 264/1.7 |
| 6,461,428 B2 | 10/2002 | Tobashi et al. | |
| 6,474,986 B2 * | 11/2002 | Oda et al. | 432/247 |
| 2003/0140853 A1 * | 7/2003 | Wada et al. | 118/715 |
| 2004/0020599 A1 * | 2/2004 | Tanaka et al. | 156/345.29 |
| 2007/0221657 A1 | 9/2007 | Arai et al. | |
| 2007/0266932 A1 * | 11/2007 | Hiramatsu | 117/88 |
| 2008/0032036 A1 * | 2/2008 | Ito et al. | 427/8 |

FOREIGN PATENT DOCUMENTS

| | | |
|---|---|---|
| JP | 2007-288163 | 11/2007 |
| JP | 2008-4767 | 1/2008 |

OTHER PUBLICATIONS

Notice of Preliminary Rejection issued by the Korean Patent Office on Aug. 18, 2011, for Korean Patent Application No. 2010-97170, and English-language translation thereof.

* cited by examiner

*Primary Examiner* — Parviz Hassanzadeh
*Assistant Examiner* — Tiffany Nuckols
(74) *Attorney, Agent, or Firm* — Finnegan, Henderson, Farabow, Garrett & Dunner, L.L.P.

(57) ABSTRACT

A semiconductor device manufacturing apparatus includes a chamber in which a wafer is loaded; a first gas supply unit for supplying a process gas into the chamber; a gas exhaust unit for exhausting a gas from the chamber; a wafer support member on which the wafer is placed; a ring on which the wafer support member is placed; a rotation drive control unit connected to the ring to rotate the wafer; a heater disposed in the ring and comprising a heater element for heating the wafer to a predetermined temperature and including an SiC layer on at least a surface, and a heater electrode portion molded integrally with a heater element and including an SiC layer on at least a surface; and a second gas supply unit for supplying an SiC source gas into the ring.

9 Claims, 2 Drawing Sheets

MANUFACTURING APPARATUS AND METHOD FOR SEMICONDUCTOR DEVICE

CROSS-REFERENCE TO RELATED APPLICATION

This application is based upon and claims the benefit of priority from the prior Japanese Patent Application No. 2009-238931 filed on Oct. 16, 2009, the entire contents of which are incorporated herein by reference.

BACKGROUND

The present invention relates to a manufacturing apparatus and method for a semiconductor device, for example, used for forming a film by supplying a reaction gas to the surface of a semiconductor wafer while heating the rear surface of the semiconductor wafer.

In recent years, as a semiconductor device is requested to realize lower price and higher performance, higher productivity in film forming process of a wafer and higher quality such as improvement in uniformity in film thickness is also required.

To satisfy such requirements, a back heating method is employed, which uses a single-wafer-processing epitaxial growth apparatus, supplies process gas while rotating a wafer at high speed of 900 rpm or higher in a chamber, and heats the wafer from the rear surface by using a heater.

Ordinarily, a heater element that constitutes the heater is fixed and connected to an electrode part as a support member in a plane of the heater element using a bolt and the like. However, since a connecting portion is deformed by heat and a resistance value is increased by the deformation, Japan Patent Application Laid-Open No. 2007-288163 (FIGS. 1, 2, and the like) discloses to provide a heater electrode portion integrated with a heater element and to connect the heater electrode portion to an electrode part apart from the heater element.

Sintered SiC is used to the heater composed of the heater element and the heater electrode portion due to its processing performance. Then, impurities are added to the heater electrode part to provide a conductive property as well as SiC coating is applied to prevent diffusion of the impurities.

When epitaxial film formation is performed using the heater, a problem arises in that the heater is deteriorated by sublimation of SiC. Then, a resistance value is increased, strength is lowered, a film forming temperature is varied, and the heater is broken by the deterioration of the heater. In contrast, with a recent requirement for improvement of productivity and a film quality in the epitaxial film formation, since it is further required to perform a process at a high temperature, there is tendency that a larger load is applied to the heater.

To cope with the problem, Japan Patent Application Laid-Open No. 2008-4767 (claim 1 and the like) discloses a method of supplying an SiC source gas into a chamber from thereabove and forming an SiC film in a sublimated portion of a heater, thereby increasing a life of the heater.

However, the method has a problem in that since a gas to be supplied must be replaced by stopping an apparatus once, a throughput is inevitably lowered.

Further, since sublimation more proceeds particularly in a connecting portion where a heater element is connected to a heater electrode portion because an electric field is concentrated to the connecting portion, the connecting portion is more deteriorated. However, when an SiC source gas is supplied from above the heater element, since the connecting portion is shaded by the heater element, it is difficult to selectively form a film to the connecting portion.

SUMMARY

According to an aspect of the present invention, there is provided a manufacturing apparatus for a semiconductor device, including: a chamber in which a wafer is loaded; a first gas supply unit for supplying a process gas into the chamber; a gas exhaust unit for exhausting a gas from the chamber; a wafer support member on which the wafer is placed; a ring on which the wafer support member is placed; a rotation drive control unit connected to the ring to rotate the wafer; a heater disposed in the ring and comprising a heater element for heating the wafer to a predetermined temperature and including an SiC layer on at least a surface, and a heater electrode portion molded integrally with a heater element and including an SiC layer on at least a surface; and a second gas supply unit for supplying an SiC source gas into the ring.

According to an aspect of the present invention, there is provided a manufacturing method for a semiconductor device including: loading a wafer into a chamber; heating the wafer by a predetermined temperature by applying a voltage to a heater electrode portion having an SiC layer on at least a surface and causing a heater element molded integrally with the heater electrode portion and having an SiC layer on at least a surface; and forming a film on the wafer by rotating the wafer and supplying a process gas onto the wafer with supplying an SiC source gas onto a rear surface side of the heater element.

DETAILED DESCRIPTION

Figure 1:
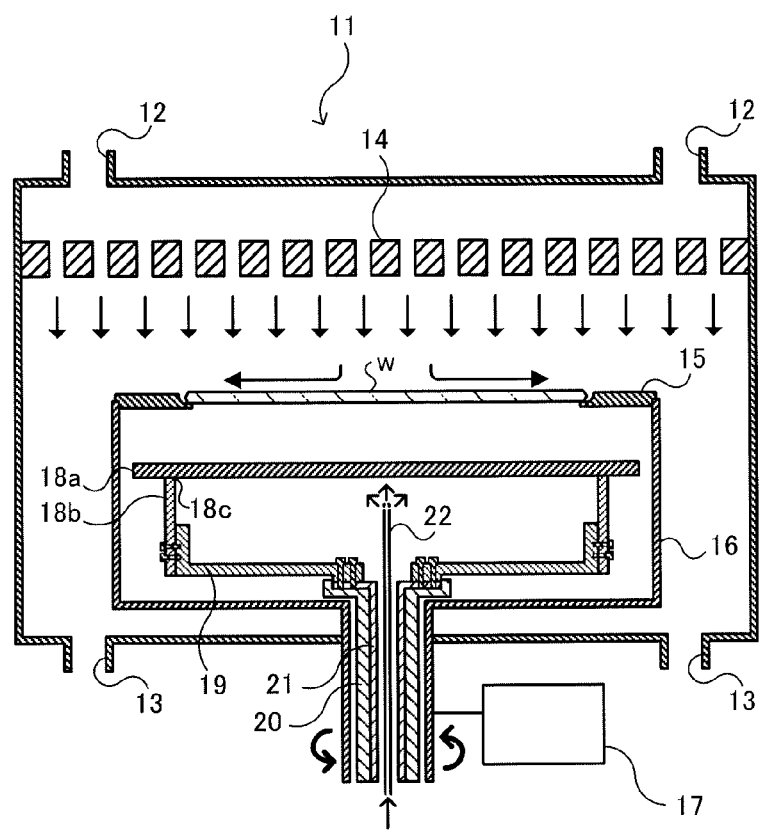
FIG. 1 to FIG. 4 are sectional views showing a structure of an epitaxial growth apparatus of an embodiment of an invention, respectively.

Reference will now be made in detail to the present embodiment of the invention, an example of which is illustrated in the accompanying drawings.

As described above, the conventional method has the problems in that the throughput is inevitably lowered because the gas to be supplied must be replaced by stopping the apparatus once and that it is difficult to cope with the deterioration of the connecting portion where the heater element is connected to the heater electrode portion.

Further, since sublimated SiC is made polycrystalline and deposited on the heater and deteriorates a surface state of the heater while an epitaxial film is formed, a problem arises in that a heater temperature is displaced and varied. Accordingly, it is necessary to suppress the progress of deterioration the heater due to the sublimation and the like in-situ. The following embodiments are achieved to solve the problems.

The embodiments of the invention will be explained below referring to the drawings.

Embodiment 1

FIG. 1 shows a sectional view of an epitaxial growth apparatus as a manufacturing apparatus for a semiconductor device of the embodiment 1. As shown in the figure, a chamber 11, in which, for example, a 200 mm φ wafer w is subjected to a film forming process, has gas supply ports 12 which are provided thereto and connected to a first gas supply unit (not shown) for supplying a process gas including a source gas such as trichlorosilane, dichlorosilane, and the like, onto the wafer w in a predetermined flow rate from above the chamber 11. Gas exhaust ports 13 are provided to lower portions of the chamber 11 at, for example, two locations and connected to a gas exhaust unit (not shown) which exhausts a gas and controls a pressure in the chamber 11 constant (to normal pressures).

Straightening vanes 14 are disposed to an upper portion of the chamber 11 to supply the process gas supplied from the gas supply ports 12 onto the wafer w in a straightened state. An annular holder 15 as a holding member is disposed on a ring 16 as a rotation member below the straightening vanes 14 to hold the wafer w around its peripheral edge portion. The ring 16 is connected to a rotation drive control unit 17 composed of a rotating shaft (not shown) and a motor (not shown) for rotating the wafer w at a predetermined rotation speed, and the like.

A heater 18 is provided in the ring 16 to heat the wafer w. The heater 18 is composed of a disc-shaped heater element 18a, which has a predetermined pattern and includes an SiC layer on at least a surface, and a heater electrode portion 18b molded integrally with the heater element 18a. The heater electrode portion 18b is composed of SiC, which is added with impurities and has a conductive property, and is further coated with an SiC film. Note that, furthermore, an annular heater may be used as the heater, and a reflector may be used for performing heating efficiently.

A booth bar 19, which is an electrode part connected to the heater electrode portion 18b, is disposed to a lower portion in the ring 16 and connected to an electrode 21 which is connected to an external power supply (not shown) and fixed to a heater shaft 20.

A gas supply nozzle 22 is disposed in the ring 16, connected to a second gas supply unit (not shown) for supplying an SiC source gas such as monomethylsilane and the like from therebelow, and has openings at its tip end.

An Si epitaxial film is formed on, for example, a φ200 mm Si wafer w using the epitaxial growth apparatus.

The wafer w is introduced into the chamber 11, and the holder 15, on which the wafer w is placed, is placed on the ring 16. A voltage is applied to the heater electrode portion 18b connected to the booth bar 19 by the electrode 21 connected to the external power supply (not shown), and the heater 18 is controlled to 1500 to 1600° C. so that an in-plane temperature of the wafer w is uniformly set to, for example, 1100° C.

The wafer w is rotated by the rotation drive control unit 17 at, for example, 900 rpm as well as the process gas is supplied onto the wafer w from the gas supply ports 12 via the straightening vanes 14 in the straightened state. The process gas is prepared so that a trichlorosilane has a concentration of, for example, 2.5% and supplied in, for example, 50 SLM.

At the time, for example, monomethylsilane as the SiC source gas is supplied onto a rear surface side of the heater element 18a in an amount of 10 sccm from the openings at the tip end of the gas supply nozzle 22 in the ring 16, and sublimation of SiC is suppressed by increasing an SiC partial pressure by shifting the following reaction composed of plural equilibrium reactions in a right direction.

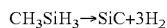

$$CH_3SiH_3 \rightarrow SiC + 3H_2$$

In contrast, the process gases containing such as excessive trichlorosilane and a dilute gas, and HCl as a reaction byproduct are exhausted downward from an outer periphery of the holder 15. These gases are exhausted from the gas exhaust ports 13 via the gas exhaust unit (not shown) so that the pressure in the chamber 11 is controlled constant (for example, to normal pressures). The Si epitaxial film is grown on the wafer w as described above.

According to the embodiment, when the epitaxial film is grown by supplying the process gas onto the wafer w, the sublimation of SiC from the heater 18 (heater element 18a and heater electrode portion 18b), in particular from a connecting portion 18c can be suppressed by increasing the SiC partial pressure by supplying the SiC source gas into the ring.

As a result, the progress of deterioration of the heater can be suppressed without interrupting the epitaxial growth apparatus so that an increase of a resistance value, a strength decrease, and deposition of polycrystalline on the heater can be suppressed. As a result, a performance and a reliability of a semiconductor device can be improved and a cost of the semiconductor device can be reduced by preventing a dispersion of a film forming temperature and a break of the heater.

Embodiment 2

Although an epitaxial growth apparatus of an embodiment 2 is configured similarly to that of the embodiment 1, the embodiment 2 is different from the embodiment 1 in that the holding member for holding the wafer w is composed of a susceptor 25 for holding an entire rear surface of the wafer w.

Figure 2:
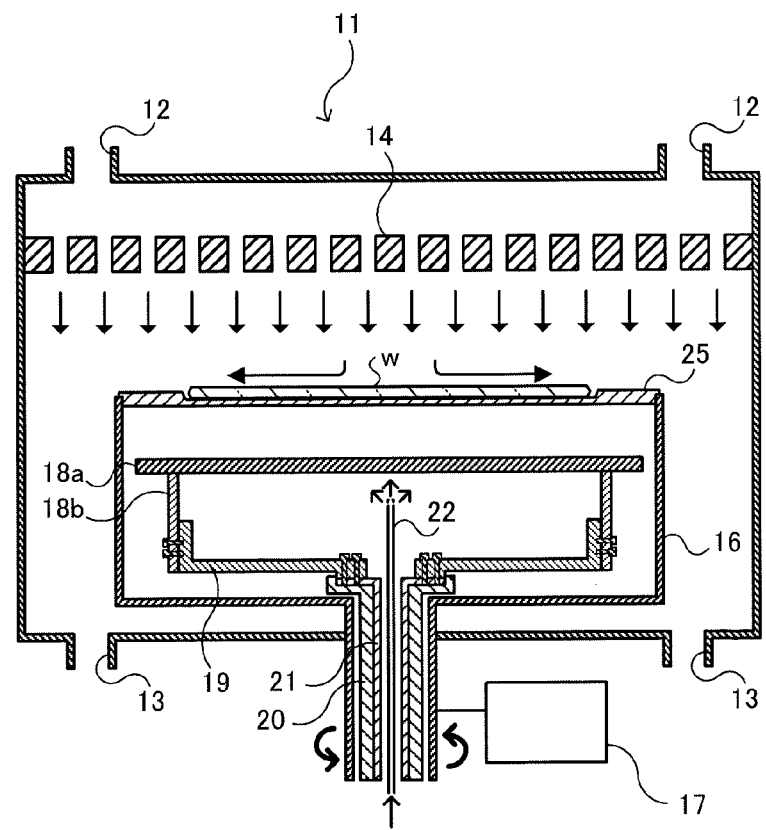

As shown in FIG. 2, the entire rear surface of the wafer w is held by the susceptor 25 and separated from an atmosphere in the ring 16. It is considered that SiC is deposited on the rear surface of the wafer w by that the SiC partial pressure in the ring 16 increases. However, the deposition of SiC can be prevented by holding the entire rear surface of the wafer w by the susceptor 25.

According to the embodiment 2, the same effect as that of the embodiment 1 can be obtained as well as a pollution of the wafer due to the deposition of SiC can be suppressed without largely modifying a structure of the epitaxial growth apparatus.

Embodiment 3

Although an epitaxial growth apparatus of an embodiment 3 is configured similarly to that of the embodiment 1, the embodiment 3 is different from the embodiment 1 in that a gas supply nozzle is interposed between the wafer w and the heater element to supply an inert gas.

Figure 3:
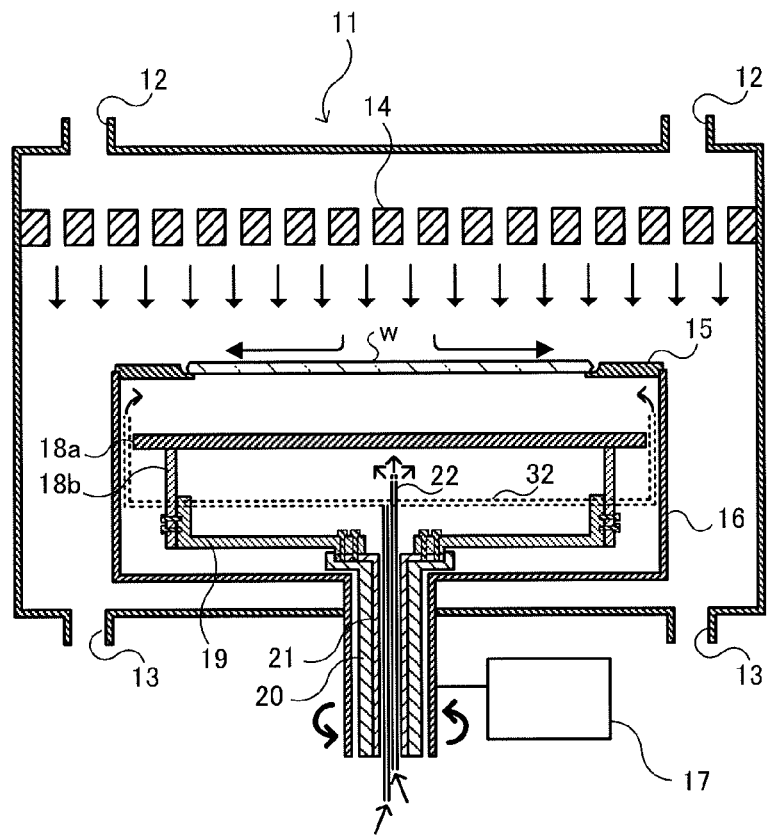

As shown in FIG. 3, the gas supply nozzle 32, which is connected to a third gas supply unit (not shown) and supplies an inert gas such as He, is disposed in the ring 16 together with a gas supply nozzle 22 which supplies an SiC source gas such as monomethylsilane and the like from downward of the ring 16. The gas supply nozzle 32 has ends branched in plural directions (for example, three directions) as shown by wave lines and is disposed such that end portions each having an opening are located above the heater element 18a. When the SiC source gas is supplied, the gas supply nozzle 32 supplies the inert gas between the wafer w and the heater element 18a.

It is considered that SiC is deposited on the rear surface of the wafer w by that the SiC partial pressure in the ring 16 increases. However, the deposition of SiC on the rear surface of the wafer w can be prevented likewise the embodiment 2 by supplying the inert gas and lowering the SiC partial pressure on the rear surface of the wafer w more than that on the rear surface side of the heater element 18a as described above.

According to the embodiment 3, the same effect as that of the embodiment 1 can be obtained as well as the pollution of the wafer due to the deposition of SiC can be suppressed without using the susceptor.

Embodiment 4

Although an epitaxial growth apparatus of an embodiment 4 is configured similarly to that of the embodiment 1, the embodiment 4 is different from the embodiment 1 in that the embodiment 4 has plural openings disposed to an upper portion of the ring.

Figure 4:
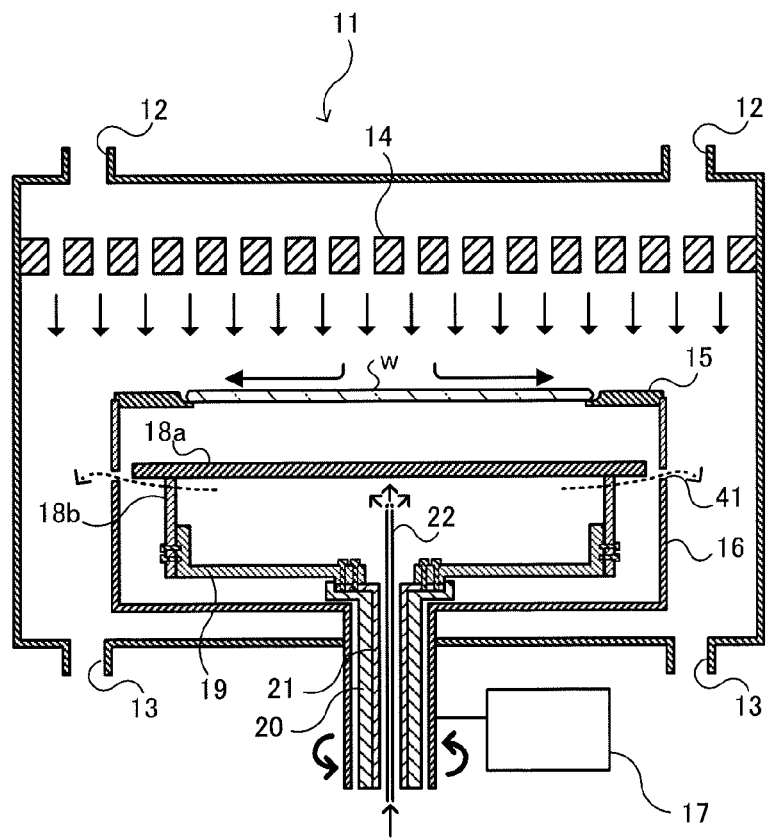

As shown in FIG. 4, in the ring 16, plural (for example, four) openings 41 are disposed around an outer periphery of the heater element 18a at positions higher than a horizontal position of a rear surface of the heater element. To suppress floating of the wafer w, a flow rate of the SiC source gas is controlled to make the pressure in the ring 16 slightly higher than that in the chamber 11 external of the ring 16 by, for example, about from 0.5 to 5 torr. As a result, the thus supplied SiC source gas is exhausted to the outside of the ring 16 (into the chamber 11) via the openings 41 without flowing upward of the heater element 18a by a pressure difference between the ring 16 and the chamber 11.

It is considered that SiC is deposited on the rear surface of the wafer w by that the SiC partial pressure in the ring 16 increases. However, the deposition of SiC on the rear surface of the wafer w can be prevented likewise the embodiment 2 by suppressing an increase of the SiC partial pressure on the rear surface of the wafer w by exhausting the SiC source gas from an outer periphery of a heater element.

According to the embodiment 4, the same effect as that of the embodiment 1 can be obtained as well as the pollution of the wafer due to the deposition of SiC can be suppressed without using the susceptor and further without providing a new gas supply system.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 μm or more in an N-type base region, P-type base region or an insulation isolation region, satisfactory element characteristics can be obtained.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of an $SiO_2$ film and an $Si_3N_4$ film, and in the case of $SiO_2$ film, monosilane ($SiH_4$) and gases of $N_2$, $O_2$, and Ar are fed, and in the case of $Si_3N_4$ film, monosilane ($SiH_4$) and gases of $NH_3$, $N_2$, $O_2$, and Ar are fed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing apparatus for a semiconductor device comprising:
   a chamber in which a wafer is loaded;
   a first gas supply unit configured to supply a process gas into the chamber;
   a gas exhaust unit configured to exhaust a gas from the chamber;
   a wafer support member on which the wafer is placed;
   a ring on which the wafer support member is placed;
   a rotation drive control unit connected to the ring, and the rotation drive configured to rotate the wafer;
   a heater disposed in the ring and the heater comprising a heater element configured to heat the wafer to a predetermined temperature and the heater element includes an SiC layer on at least a surface, and a heater electrode portion molded integrally with the heater element and the heater electrode portion includes an SiC layer on at least a surface; and
   a second gas supply unit configured to supply gases which includes an SiC source gas into the ring, wherein the SiC source gas is monomethylsilane.

2. The manufacturing apparatus for the semiconductor device according to claim 1, wherein the wafer support member holds an entire rear surface of the wafer.

3. The manufacturing apparatus for semiconductor device according to claim 1, wherein the second gas supply unit comprises a gas supply nozzle having an opening at a tip end.

4. The manufacturing apparatus for the semiconductor device according to claim 1, further comprising a third gas supply unit disposed between the wafer and the heater element, the third gas supply unit configured to supply an inert gas.

5. The manufacturing apparatus for the semiconductor device according to claim 4, wherein the third gas supply unit includes a nozzle which comprises a plurality of branched ends, an opening is disposed at each of tip of the branched ends.

6. The manufacturing apparatus for the semiconductor device according to claim 1, wherein an opening is disposed in the ring at a position higher than a horizontal position of a rear surface of the heater element.

7. The manufacturing apparatus for the semiconductor device according to claim 6, wherein a plurality of the openings are disposed in the ring.

8. The manufacturing apparatus for the semiconductor device according to claim 6, wherein the wafer support member holds a peripheral edge portion of the wafer.

9. The manufacturing apparatus for the semiconductor device according to claim 7, wherein the third gas supply unit controls a pressure in the ring so that the pressure becomes higher than a pressure in the chamber.

* * * * *